(12) United States Patent
Roohparvar et al.

(10) Patent No.: US 8,068,366 B2
(45) Date of Patent: Nov. 29, 2011

(54) ANALOG READ AND WRITE PATHS IN A SOLID STATE MEMORY DEVICE

(75) Inventors: Frankie F. Roohparvar, Monte Sereno, CA (US); Vishal Sarin, Cupertino, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/829,782

(22) Filed: Jul. 2, 2010

(65) Prior Publication Data
US 2010/0271872 A1  Oct. 28, 2010

Related U.S. Application Data

(63) Continuation of application No. 12/098,652, filed on Apr. 7, 2008, now Pat. No. 7,768,832.

(51) Int. Cl.
*G11C 16/06* (2006.01)

(52) U.S. Cl. ......... 365/185.17; 365/189.07; 365/189.08; 365/196; 365/210.12

(58) Field of Classification Search ............. 365/185.15, 365/189.07, 189.08, 196.12
See application file for complete search history.

(56) References Cited

U.S. PATENT DOCUMENTS

| | | | |
|---|---|---|---|
| 5,907,501 A | 5/1999 | Hwang | |
| 5,973,956 A | 10/1999 | Blyth et al. | |
| 6,208,542 B1 | 3/2001 | Wang et al. | |
| 6,865,186 B1 | 3/2005 | Jackson et al. | |
| 2007/0211529 A1* | 9/2007 | Santis et al. | ............. 365/185.08 |

* cited by examiner

*Primary Examiner* — Thong Q Le
(74) *Attorney, Agent, or Firm* — Leffert Jay & Polglaze, P.A.

(57) ABSTRACT

A memory array in a memory device is coupled to an analog I/O data interface that enables analog voltage levels to be written to the memory array. The I/O interface comprises a plurality of analog data paths that each includes a capacitor for storing charge corresponding to a target voltage to which a selected memory cell, coupled to its respective data path, is to be programmed. A plurality of comparators can be included in the I/O interface, with each such comparator coupled to a respective bit line. Such a comparator can compare a threshold voltage of a selected memory cell to its target voltage and inhibits further programming when the threshold voltage equals or exceeds the target voltage.

19 Claims, 8 Drawing Sheets

US 8,068,366 B2

ANALOG READ AND WRITE PATHS IN A SOLID STATE MEMORY DEVICE

RELATED APPLICATION

This application is a Continuation of U.S. application Ser. No. 12/098,652, titled "ANALOG READ AND WRITE PATHS IN A SOLID STATE MEMORY DEVICE" filed Apr. 7, 2008, now U.S. Pat. No. 7,768,832, issued Aug. 3, 2010, which is commonly assigned and incorporated herein by reference.

TECHNICAL FIELD

The present disclosure relates generally to semiconductor memory and more particularly, in one or more embodiments, to non-volatile memory devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
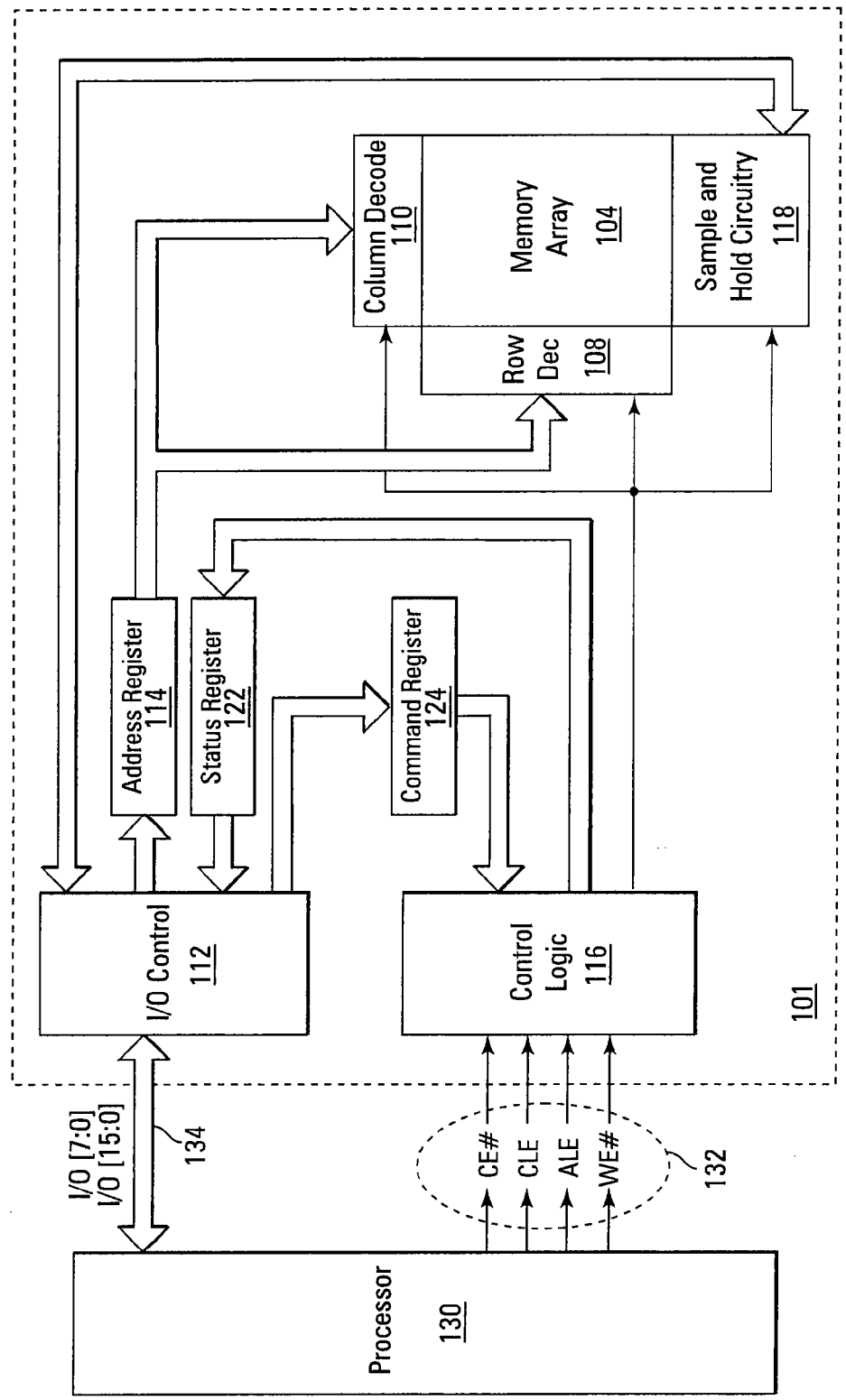
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage ($V_t$) ranges of 200 mV for each range, with each range corresponding to a distinct data state, thereby representing four data values or bit patterns. Typically, a dead space or margin of 0.2V to 0.4V is between each range to keep the $V_t$ distributions from overlapping. If the $V_t$ of the cell is within the first range, the cell may be deemed to store a logical 11 state and is typically considered the erased state of the cell. If the $V_t$ is within the second range, the cell may be deemed to store a logical 10 state. If the $V_t$ is within the third range, the cell may be deemed to store a logical 00 state. And if the $V_t$ is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the $V_t$ of the target memory cell is moved from the $V_t$ range corresponding to the 11 logic state to the $V_t$ range corresponding to the 10 logic state. Following programming of the LSBs, the most-significant bit (MSB) of each cell is programmed in a similar manner, shifting the $V_t$ where necessary. When reading an MLC of a traditional memory device, one or more read operations determine generally into which of the ranges the $V_t$ of the cell voltage falls. For example, a first read operation may determine whether the $V_t$ of the target memory cell is indicative of the MSB being a 1 or a 0 while a second read operation may determine whether the $V_t$ of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as $V_t$ ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their $V_t$ levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the $V_t$ levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
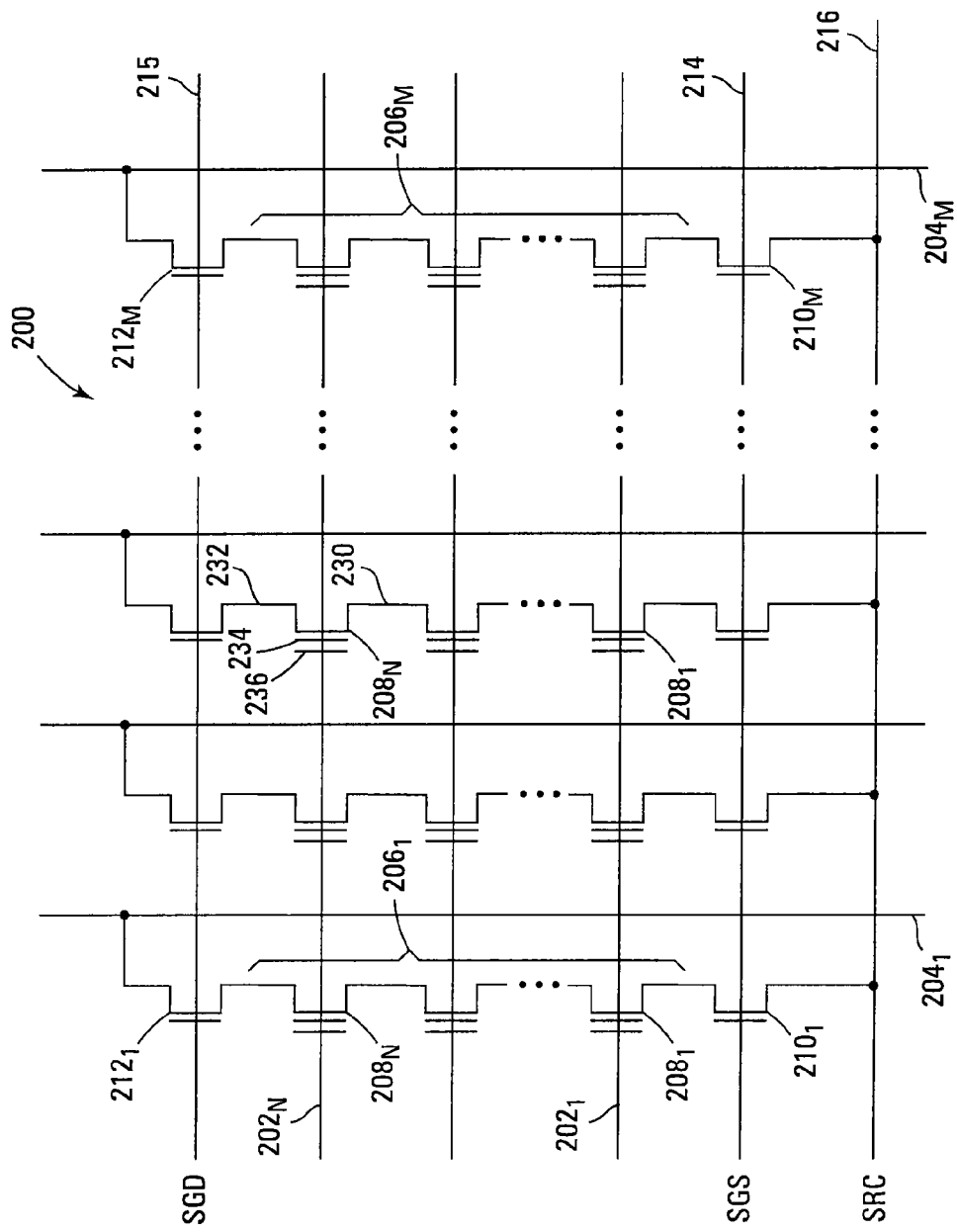
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_m$. Each NAND string includes transistors $208_1$ to $208_N$, each located at an intersection of a word line 202 and a bit line 204. The transistors 208, depicted as floating-gate transistors in FIG. 2, represent non volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
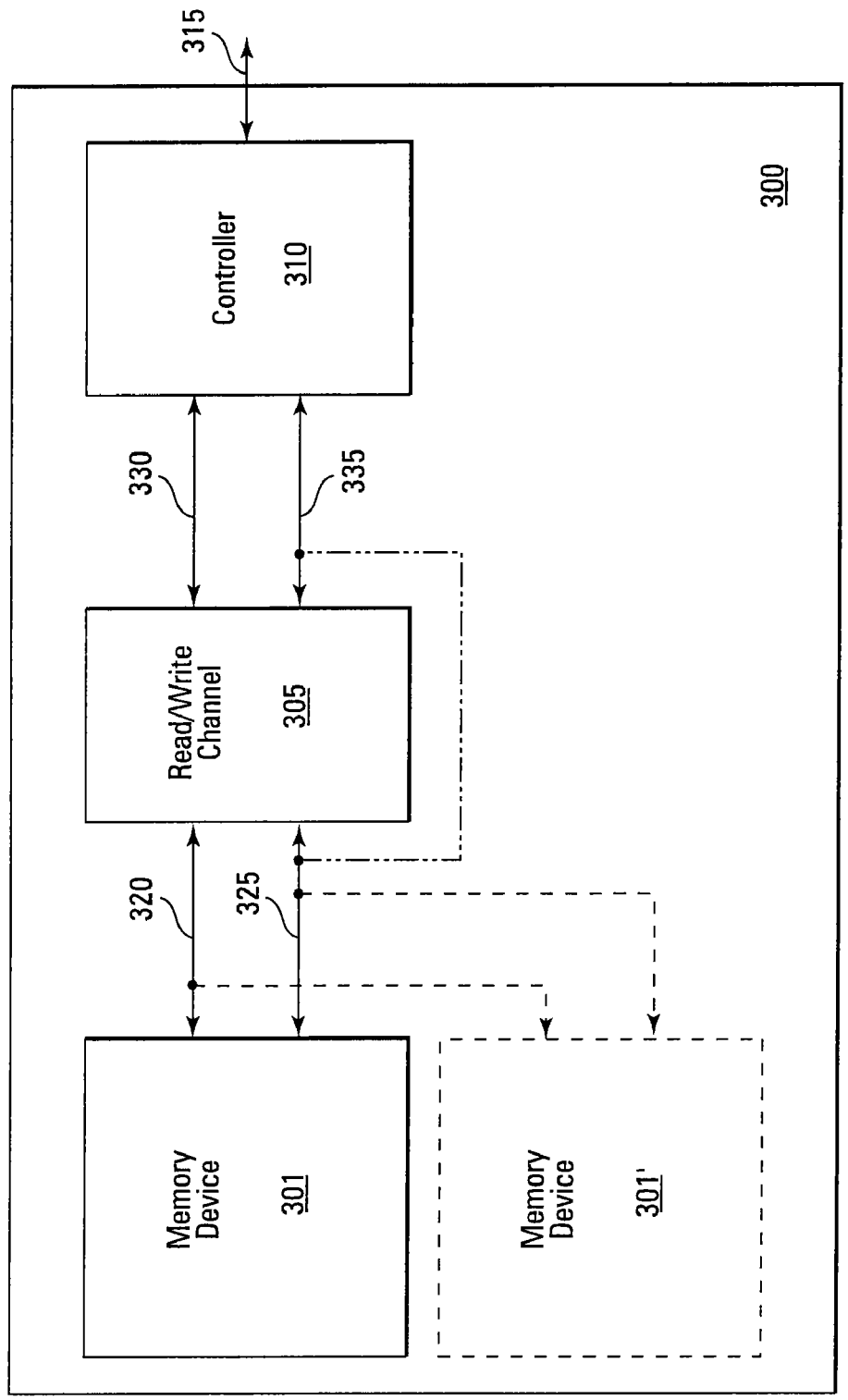
FIG. 3 is a block schematic of a solid state bulk storage system in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
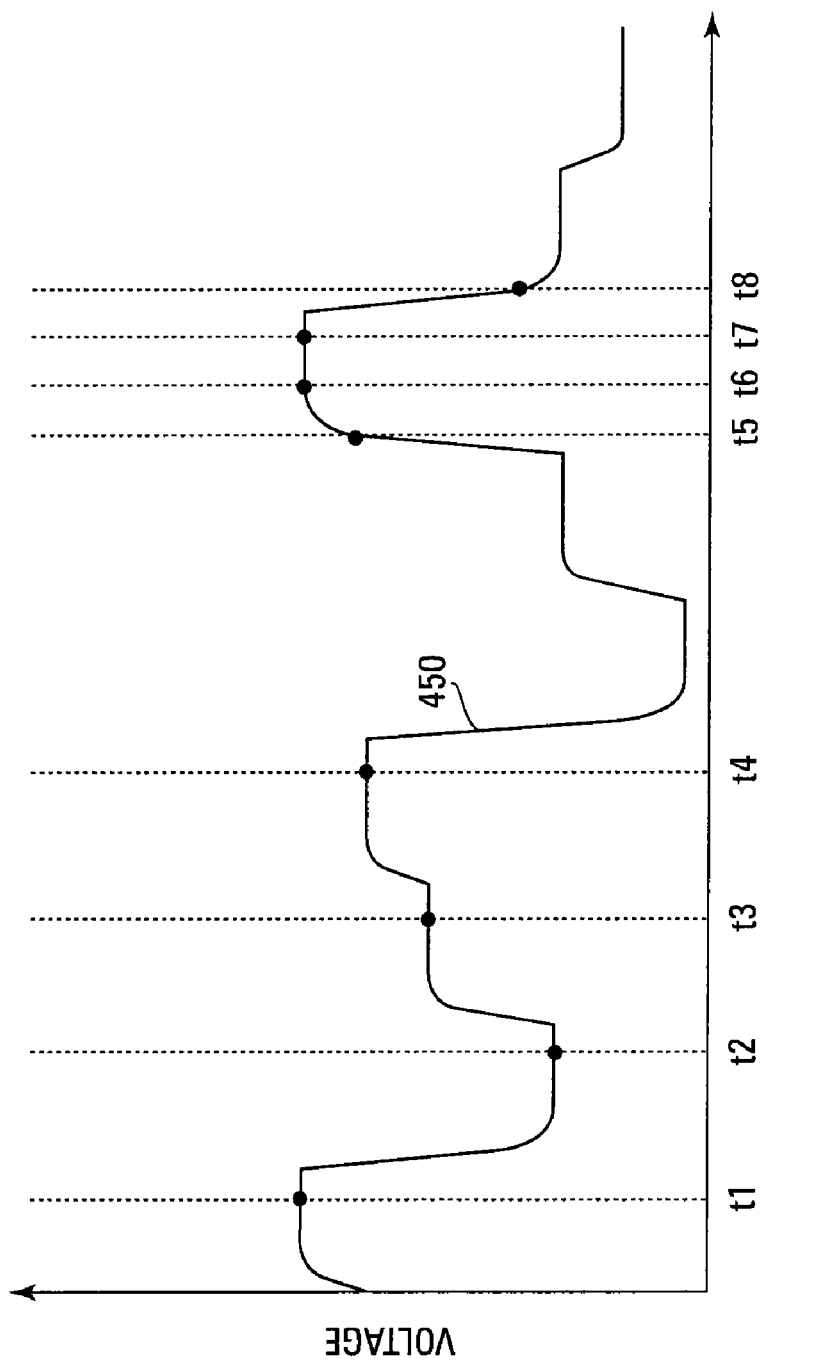
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
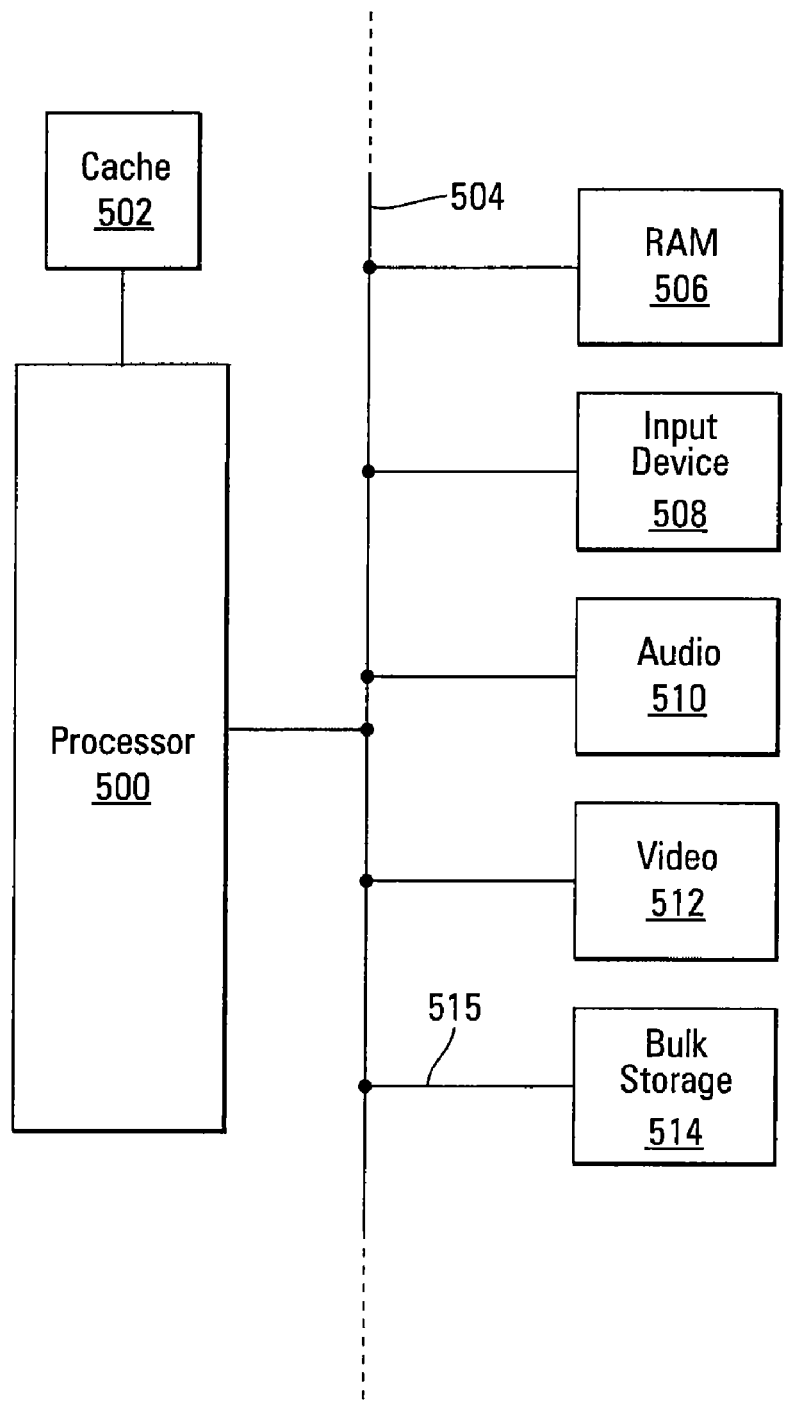
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

Figure 6:
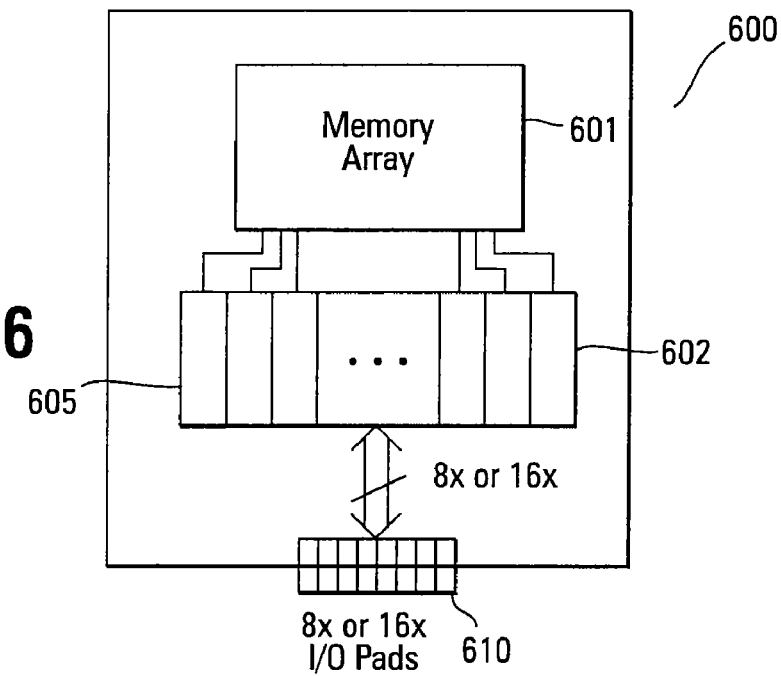
FIG. 6 is a block diagram of one embodiment of a memory device, in accordance with the bulk storage system of FIG. 3, having an input/output interface for reading and writing analog voltage levels.

FIG. 6 illustrates a block diagram of one embodiment of a memory device 600, of the bulk storage system of FIG. 3, having an analog input/output data interface for reading and writing analog signals. The block diagram of FIG. 6 illustrates only a simplified memory device that highlights the elements relevant to the analog I/O data interface of the present disclosure. Other elements of the memory device 600 are shown and discussed in above-described embodiments or are known by those skilled in the art.

The memory device 600 comprises a memory array 601 that has non-volatile memory cells organized in rows and columns. The rows are coupled to word lines and the columns are coupled to bit lines. The array format can be fabricated as a NAND architecture, a NOR architecture, or some other type of architecture. The non-volatile memory cells, in one embodiment, are floating gate memory cells.

The memory array 601 is coupled to a plurality of analog data paths 602. In one embodiment, there is one data path for each bit line of the memory array 601. Each analog data path 602 coupled to a bit line is shared with all of the memory cells on that particular bit line. The selection of a particular word line with a verify voltage causes that word line to be coupled to its respective analog data path.

The analog data paths 602 act as both a data cache that stores the data and an input path to access the memory cells in the array 601. The data paths 602 are located between the analog I/O pads 610 of the memory device 600 and the memory array 601. The data paths 602 are coupled to the 8 or 16 analog I/O pads 610 by an 8 or 16 bit wide bus. Alternate embodiments can use other bus widths. One embodiment of an analog data path 605 is illustrated in FIG. 7.

Figure 7:
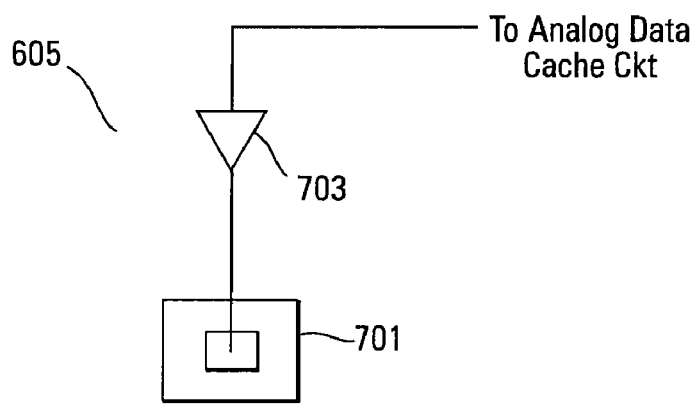
FIG. 7 is a block diagram of one embodiment of an analog I/O data path in accordance with the memory device of FIG. 6.

The analog I/O data path 605 of FIG. 7 comprises the I/O pad 701 that includes a unity gain amplifier 703. The amplifier 703 provides an amplification factor of one to improve the signal strength of the input analog voltage. In one embodiment, the amplifier block 703 is bidirectional to enable voltages from the memory array to be output on the I/O pads 701.

Figure 8:
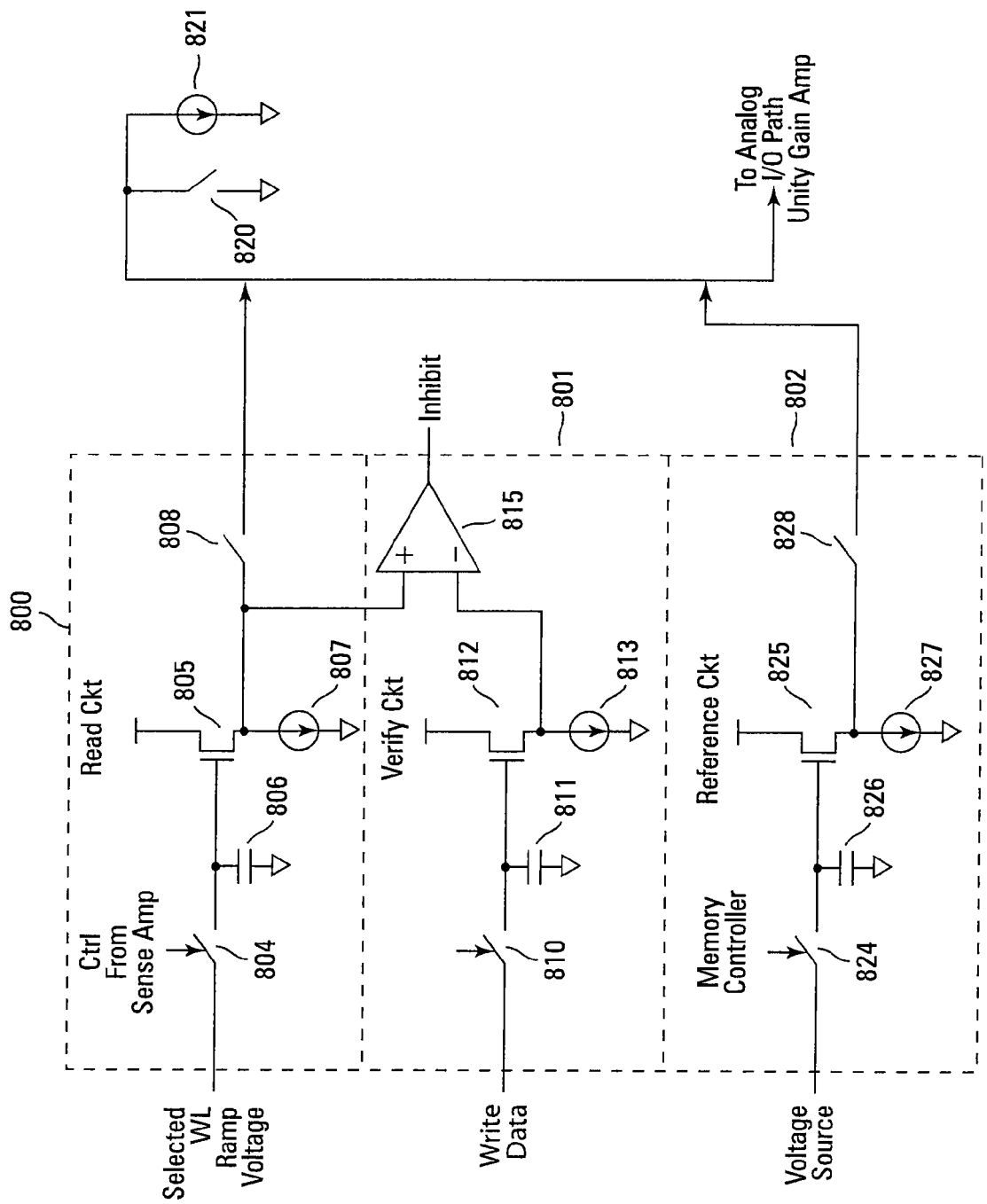
FIG. 8 is a block diagram of one embodiment of a data cache circuit in accordance with the memory device of FIG. 6.

FIG. 8 illustrates an analog data cache circuit that is coupled to the analog I/O path 605 of FIG. 7. In one embodiment, the data cache circuit is considered part of the analog data path 605 of FIG. 6.

The analog data cache circuit comprises a read circuit 800, a verify circuit 801, and a reference circuit 802. The circuit of FIG. 8 is for purposes of illustration only as the data cache function can be accomplished in many different ways.

The read circuit 800 comprises a voltage storage device 806 that makes up a sample and hold portion of the circuit. The illustrated embodiment uses a capacitor 806 to store the voltage. Alternate embodiments may use another type of capacitive element or some other means of voltage storage. The capacitor 806 is connected to the selected word line ramp voltage through a switch 804. The switch is controlled by the control signal from the sense amplifier circuit. In operation, the selected word line ramp voltage increases until it reaches the $V_t$ that turns on the selected memory cell. During the ramped voltage, the switch is normally closed so that the voltage being stored in the capacitor 806 also increases with the input voltage. When the ramp voltage reaches the $V_t$ of the selected memory cell, current begins to flow in the bit line. The sense amplifier detects the current and generates the control signal that opens the switch 804. The open switch 804 causes the $V_t$ level that initiated the current flow to be stored in the capacitor 806. This is the threshold voltage to which the selected memory cell is currently programmed.

The stored threshold voltage is output through an NMOS transistor 805 that is connected to a current source 807 through the source connection of the transistor 805. The drain connection of the transistor 805 is connected to the supply voltage $V_{CC}$.

The NMOS transistor 805 is connected in a source follower configuration to drive the stored threshold voltage, through an output switch 808, to the I/O node (i.e., I/O line) of the memory device. The output switch 808 is normally open to disconnect the read circuit 800 from the I/O line. During this time, the I/O switch 820 is closed in order to discharge the I/O line to ground so that any voltage put on the line starts at 0V. After the $V_t$ of the selected cell is stored in the capacitor 806, the output switch 808 is closed to connect the NMOS transistor 805 to the I/O line and the I/O switch 820 is opened. A current source 821 on the I/O line increases the drive current of the line.

The output of the read circuit 800 will not be the same as the $V_t$ stored in the capacitor 804. Since the $V_t$ is applied to the gate of the NMOS transistor 805, the source of the transistor 805 rises to 1.30V–$V_t$ where the 1.30V is the gate-to-source voltage drop of the transistor 805. Thus, if $V_t$ is 1.0V, then the read circuit will output 0.30V as the read $V_t$.

One embodiment, as illustrated in FIG. 8, uses a reference circuit 802. This reference circuit 802 is substantially similar to the read circuit 800 in that it comprises a switch controlled by the sense amplifier control signal, a storage capacitor 826, an NMOS transistor 825 configured in a source follower configuration with a current source 827 on the source connection, and an output switch 828 that is open until the $V_t$ is stored in the capacitor 826 and the input switch 824 is opened.

The reference circuit 802 operates by the memory controller sending a command to a voltage source to store the target $V_t$ of the selected memory cell in the capacitor 826 of the reference circuit 802. The input switch 824 is then opened by the controller to contain the target $V_t$ in the capacitor 826. The reference circuit 802 can then drive this value out, through the output switch 828, to the I/O line. As discussed previously, the I/O line is first discharged by the discharge switch 820 so that the output voltage starts at 0V. Even though the same voltage drop exists across the transistor 825 as in the read circuit 800, the memory controller now knows the actual $V_t$ that was stored in the reference circuit 802. When the reference circuit 802 output is read from the I/O line by the memory controller, the controller knows the $V_t$ value that corresponds to the voltage that was read from the I/O line. Thus, when the controller reads this same voltage during the time that the read circuit 800 is driving its voltage onto the I/O line, it knows the $V_t$ that was stored in the read circuit capacitor 806.

The read circuit 800 output and the reference circuit 802 output can be alternately connected to the I/O line by the memory controller during separate read cycles. The controller can alternate the closing of the respective output switches 808, 828 of each circuit 800, 802 in order to put the desired output onto the I/O line. The I/O line is coupled to the unity gain amplifier 703 of FIG. 7.

The reference circuit has the added benefit of correcting the read circuit $V_t$ for temperature variations. Since the reference circuit output voltage will vary in a similar manner as the read circuit output and the stored $V_t$ value in the reference circuit is known, the memory controller can determine the actual $V_t$ stored in the read circuit by a translation table stored in memory.

The verify circuit 801 includes a comparator function 815 that, in one embodiment, comprises an operational amplifier configured as a comparator 815. The comparator circuit 815 compares the voltage from the read circuit 800 output with the voltage from a verify circuit source follower transistor 812 output. The comparator circuit 815 then outputs an INHIBIT signal when the two signals are substantially equal. The INHIBIT signal is used to inhibit programming of the memory cell that has reached its threshold voltage. The verify circuit source follower transistor 812 is coupled to a current source 813 on the source connection.

For operation of the circuit, the analog voltage to be programmed into the cell is loaded into the sample/hold circuit. This is accomplished by closing the switch 810 so that the incoming data is sampled by capacitor 811. The switch 810 is then opened and the capacitor 811 now holds the target data.

The selected cell is then programmed as described subsequently. Each programming pulse applied to the selected cell moves $V_t$ a certain threshold voltage distance. A read and verify operation is performed between each programming pulse to determine if the $V_t$ has reached the target voltage.

The verification operation comprises storing the target $V_t$ in a data storage device, such as a capacitor 811, of the verify circuit 801. This can be accomplished during the verify operation or at the same time as when the capacitor 826 in the reference circuit 802 was programmed with the target $V_r$. After the verify capacitor 811 has been programmed, the input switch 810 is opened to store the voltage on the capacitor 811. A read operation is then performed.

As discussed previously, the read operation comprises a representation of a ramp voltage being applied to the input of the read circuit 800 until $V_t$ is reached and stored in the capacitor 806. The output of the source follower transistor 805 is then applied to the input of the comparator circuit 815. If the cell $V_t$ is less than the target $V_t$, the INHIBIT signal indicates (e.g., a logical low signal) that the cell needs an additional program pulse. The above-described programming sequence is then repeated. If the cell $V_t$ is substantially equal to or higher than the target $V_t$, the INHIBIT signal indicates (e.g., a logical high signal) that the cell does not need any further programming pulses and the cell is put into the "inhibit" state.

The "inhibit" state is indicated when the output of the source follower transistor 805 of the read circuit is at least equal to the output of the source follower transistor 812 of the verify circuit 801. At this point, the comparator circuit 815 outputs an INHIBIT signal. In one embodiment, the INHIBIT signal is a logical 1. The INHIBIT signal is used to initiate an inhibit function.

The inhibit function can be accomplished using various methods in response to a circuit receiving the INHIBIT signal. For example, the bit line bias can be changed from the program enable voltage of 0V, used during a programming operation, to $V_{CC}$ that inhibits programming of memory cells coupled to that particular bit line. The bit line voltage can also be varied between 0V and $V_{CC}$ to slow programming instead of completely inhibiting programming.

The representation of the analog ramp voltage for the above embodiments can be a conditioned version of a selected word line ramp voltage. Conditioning operations include reducing the voltage range (e.g., dividing the selected word line ramp voltage by 5), level shifting (e.g., shifting the selected word line ramp voltage where −2V to +3V changes to +2V to +3V), and buffering.

Figure 9:
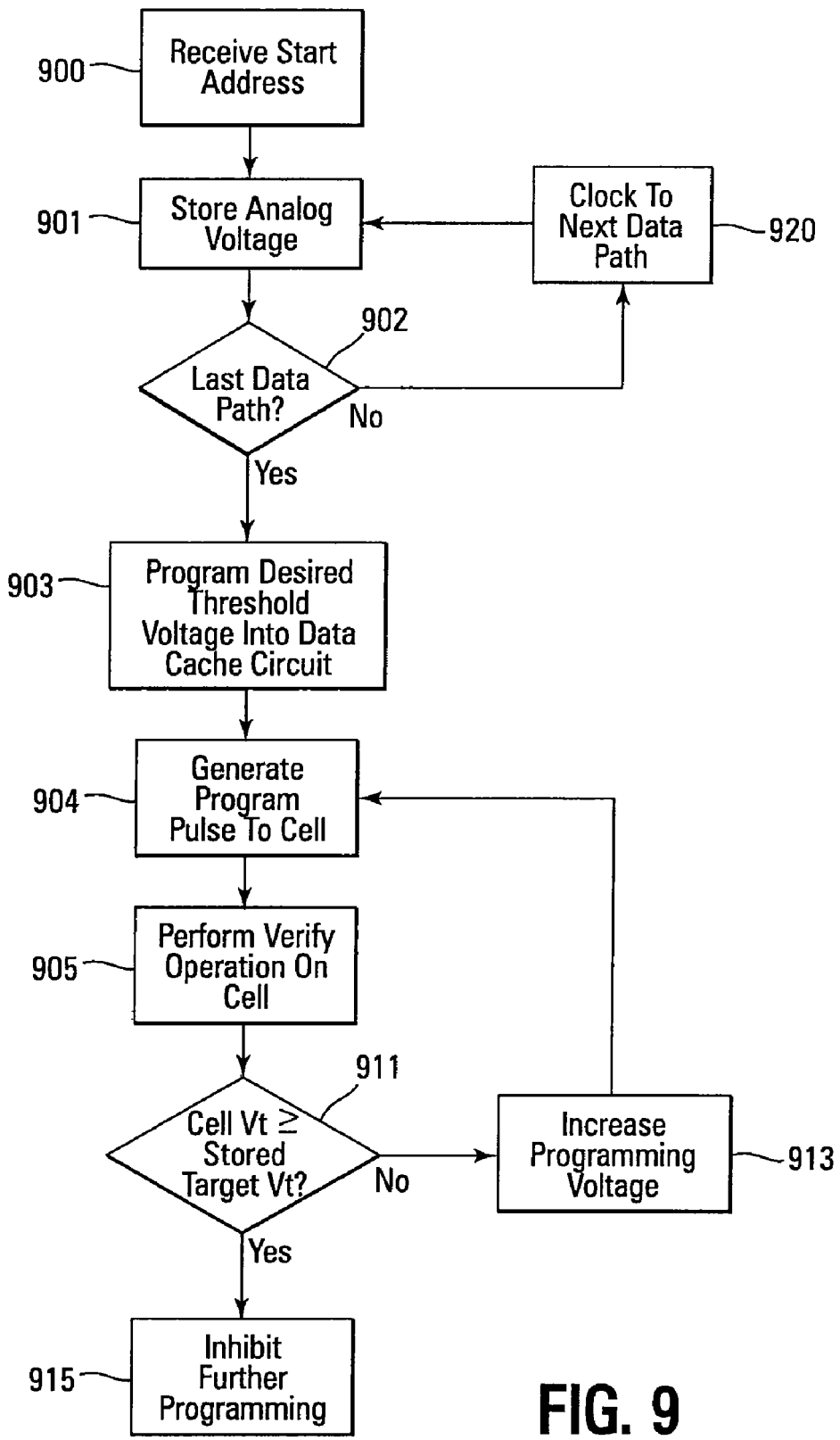
FIG. 9 is a flowchart of one embodiment of a method for programming the memory device of FIG. 6 having the analog data paths.

One embodiment of an operation of the circuit of FIG. 6 is illustrated in the flowchart of FIG. 9. The method begins when the memory device receives an address from which the programming is to start 900. The controller then stores an analog voltage 901 in the analog data path that is associated with the start address. This analog voltage is the voltage that is to be written to the memory cell currently associated with the analog data path. The associated memory cell is indicated by the selected memory cell at the intersection of a word line and the associated bit line.

As discussed previously, the analog voltage to be written to the selected memory cell is representative of a multiple bit pattern to be stored in the selected memory cell. This bit pattern can be two or more bits, each bit pattern being represented by a different threshold voltage. Another embodiment stores only a single bit in each memory cell.

The data path currently associated with the present memory cell address is then checked to determine if it is the final data path for programming 902. The final data path may be the last one as indicated by the memory controller in a length command (as measured from the start address), in a final address command, the last data path for a memory page or block being programmed, or some other way of determining the final analog data path for programming.

If the data path being programmed is not the final data path 902, the programming is clocked or incremented to the next data path 920 in the page or block. The next data path is then programmed with the analog voltage and the process repeated until the final data path is reached 902.

Once all of the desired analog data paths have been loaded with the appropriate analog voltage (i.e., data) to be programmed into their respective memory cells, the voltages are then transferred to the respective memory cells. This is accomplished through a memory cell programming/verification process.

A target voltage that is representative of the desired analog voltage (i.e., target data) that is to be programmed into the selected memory cell is stored in the verify circuit portion of the sample/hold circuit 903. In an alternate embodiment, the reference circuit is also programmed with this data. An initial programming pulse is then generated to bias the word line that is connected to the control gate of the selected memory cell 904.

During a typical programming operation, the selected cell is biased by a series of incrementally increasing programming pulses. A memory cell typically starts the programming operation in an erased state with a negative threshold voltage. Each programming pulse increases the threshold voltage, $V_t$, of the memory cell a certain voltage depending on the programming voltage pulse level.

The verify operation as described previously is then performed on the selected memory cell 905 to determine if it is programmed to the target threshold voltage 911. The verify operation determines if the selected cell threshold voltage is greater than or equal to the stored target voltage.

As described previously, the verify operation includes biasing the word line with a ramp voltage until the memory cell starts to conduct and produce a current on the bit line. Once the current sensing circuit detects the bit line current, it generates a control signal indicating to the sample/hold circuitry to store the current ramped read voltage, or an indication of the current ramped read voltage, that caused the cell to turn on. The stored, target analog voltage is compared to the sample and hold voltage from the ramped read voltage in order to determine if the selected memory cell has been programmed to the target threshold voltage 911. In other words, the selected cell is checked to determine if the target data has been programmed.

If the selected memory cell has been programmed 911, further programming of the selected cell is inhibited 915. The bit line inhibit can be accomplished as discussed previously or using some other inhibit method.

If the selected memory cell has not yet reached the target threshold voltage 911, the programming voltage is increased 913. Another programming pulse at the increased programming voltage is then generated and the process repeated until the threshold voltage of the selected cell is substantially the same as the stored analog voltage to be programmed. The threshold voltage of the selected cell does not have to be exactly equal to the desired analog voltage in order for the selected cell to be considered programmed. The cell may be under or over programmed by hundredths or thousandths of a volt and still be considered programmed.

CONCLUSION

One or more embodiments of the present disclosure provide an analog I/O data interface with a memory device adapted to store analog voltages representative of digital bit patterns. One such analog I/O data interface, comprised of a plurality of analog data paths having storage and comparison capabilities, stores a target voltage for each bit line and compares a threshold voltage on a respective programmed cell with the stored target voltage. The data path then inhibits further programming once the target voltage is reached.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. An analog input/output data interface comprising:
an analog interface configured to couple a memory array to an external circuit; and
an analog data cache, coupled between the analog interface and the memory array, for storing an analog signal representative of data, wherein the analog interface and the analog data cache are configured to accept the analog signal from the external circuit for storing in the memory array, the analog data cache comprising a comparator circuit coupled to a storage element of the analog data cache and a selected memory cell of the memory array, the comparator circuit configured to compare a signal from the storage element with a voltage from the selected memory cell and generate an inhibit signal that inhibits further programming in response to the comparison.

2. The interface of claim 1 wherein the analog signal is representative of a digital bit pattern.

3. The interface of claim 1 wherein the analog data cache comprises a voltage storage device that is configured to store the analog signal.

4. The interface of claim 1 wherein the analog interface comprises a circuit configured to produce unity gain.

5. The interface of claim 4 wherein the circuit to produce unity gain is bidirectional to enable the memory array to output a signal to the external circuit.

6. The interface of claim 5 wherein the signal output by the memory array is an analog signal representative of a digital bit pattern stored in the memory array.

7. A memory device comprising:
an array of memory cells; and
an analog input/output data interface coupled to the memory array, the interface comprising a plurality of analog data paths, each analog data path comprising a storage element configured to store an analog signal, input to the memory device, that is to be programmed into a selected memory cell of the memory array, the analog input/output data interface further comprising a comparator circuit coupled to the storage element and the selected memory cell, the comparator circuit configured to compare a signal from the storage element with a voltage from the selected memory cell and generate an inhibit signal that inhibits further programming in response to the comparison.

8. The device of claim 7 and further including a memory controller that is configured to control programming of the analog signal input to the selected memory cell.

9. A non-volatile memory device comprising:
an array of memory cells coupled to bit lines; and
an analog I/O interface coupled to the memory array through the bit lines, the interface comprising a plurality of analog data paths, each analog data path coupled to a different bit line and comprising:
a read circuit configured to store a threshold voltage of a selected memory cell and output an indication of the threshold voltage to an I/O node of the memory device; and
a verify circuit configured to store a target threshold voltage for the selected memory cell and comprising a comparison circuit configured to generate an inhibit signal in response to a comparison of the threshold voltage from the read circuit and the target threshold voltage.

10. The device of claim 9 wherein the read circuit comprises a sample and hold circuit.

11. The device of claim 10 wherein the sample and hold circuit comprises a switch coupled to a capacitive element and the read circuit further comprises a source follower transistor coupled to the capacitive element and the switch wherein an output of the source follower transistor is coupled to the comparison circuit and switchably coupled to the I/O node.

12. The device of claim 9 wherein each analog data path further comprises a reference circuit, coupled to the I/O node, that is configured to correct the read circuit for temperature variations.

13. The device of claim 12 wherein the reference circuit comprises:
an input switch coupled to a voltage source;
a capacitive element coupled to the input switch; and
a transistor in a source follower configuration having a gate connection coupled to the input switch and capacitive element and an output switchably coupled to the I/O node.

14. The device of claim 13 wherein the reference circuit further comprises a current source coupled to a source connection of the transistor.

15. A method for operating a memory device having a plurality of analog data paths coupled to a memory array, the method comprising:
storing an analog signal in an analog data path, of the plurality of analog data paths, that is associated with a selected memory cell;
programming a target threshold voltage into a data cache circuit of the analog data path that is associated with the selected memory cell;
applying a programming pulse to the selected memory cell to program the selected memory cell with the analog data signal;
determining a threshold voltage of the selected memory cell;
comparing, in the analog data path, the threshold voltage of the selected memory cell with the target threshold voltage; and
inhibiting programming when the threshold voltage of the selected memory cell is equal to or greater than the target threshold voltage.

16. The method of claim 15 wherein comparing comprises:
a comparison circuit of a verify circuit of the associated analog data path comparing the target threshold voltage to the threshold voltage of the selected memory cell; and the comparison circuit generating an inhibit signal when the threshold voltage of the memory cell is equal to or greater than the target threshold voltage.

17. The method of claim 15 and further comprising generating a reference voltage that temperature compensates determining the threshold voltage of the selected memory cell.

18. The method of claim 15 wherein storing the analog signal further comprises:

incrementing through the plurality of analog data paths; and storing an analog signal in each of the plurality of analog data paths.

19. The method of claim 16 wherein determining a threshold voltage of the selected memory cell comprises:

applying a ramped voltage to a control gate of the selected memory cell until the selected memory cell produces a current on an associated bit line; and causing sample and hold circuitry of the verify circuit to store an indication of the ramped voltage that produced the current.

* * * * *